(12) United States Patent
Nakazawa et al.

(10) Patent No.: US 8,937,363 B2
(45) Date of Patent: Jan. 20, 2015

(54) SOLID-STATE IMAGING DEVICE AND ELECTRONIC APPARATUS

(75) Inventors: Masashi Nakazawa, Kanagawa (JP); Tomoyuki Hirano, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/426,685

(22) Filed: Mar. 22, 2012

(65) Prior Publication Data
US 2013/0020667 A1  Jan. 24, 2013

(30) Foreign Application Priority Data
Mar. 30, 2011 (JP) ................................ 2011-073925

(51) Int. Cl.
  *H01L 31/00* (2006.01)
  *H01L 27/146* (2006.01)
(52) U.S. Cl.
  CPC ...... *H01L 27/14636* (2013.01); *H01L 27/1464* (2013.01)
  USPC ..................... 257/440; 257/436; 257/E27.135
(58) Field of Classification Search
  CPC ................... H01L 27/14601; H01L 27/14609; H01L 27/14647
  USPC ................. 257/436, 440, E27.134–E27.135; 250/214.1; 348/272–283, 294
  See application file for complete search history.

(56) References Cited

U.S. PATENT DOCUMENTS

| | | | |
|---|---|---|---|
| 5,739,851 A * | 4/1998 | Ohsawa et al. | 348/311 |
| 2003/0209651 A1* | 11/2003 | Iwasaki | 250/214.1 |
| 2004/0159794 A1* | 8/2004 | Morii et al. | 250/370.11 |
| 2011/0001051 A1* | 1/2011 | Tanaka | 250/366 |
| 2011/0019042 A1* | 1/2011 | Yamaguchi | 348/280 |
| 2011/0248176 A1* | 10/2011 | Mochizuki et al. | 250/370.11 |
| 2013/0020667 A1* | 1/2013 | Nakazawa et al. | 257/432 |

FOREIGN PATENT DOCUMENTS

JP  2003-332551  11/2003

* cited by examiner

*Primary Examiner* — Colleen A Matthews
*Assistant Examiner* — Christopher Johnson
(74) *Attorney, Agent, or Firm* — Sheridan Ross P.C.

(57) ABSTRACT

A solid-state imaging device includes a photoelectric conversion film which is interposed between two transparent electrodes outside a semiconductor substrate, wherein a film surface of the photoelectric conversion film is provided so as to incline with respect to a front surface of the semiconductor substrate.

17 Claims, 9 Drawing Sheets

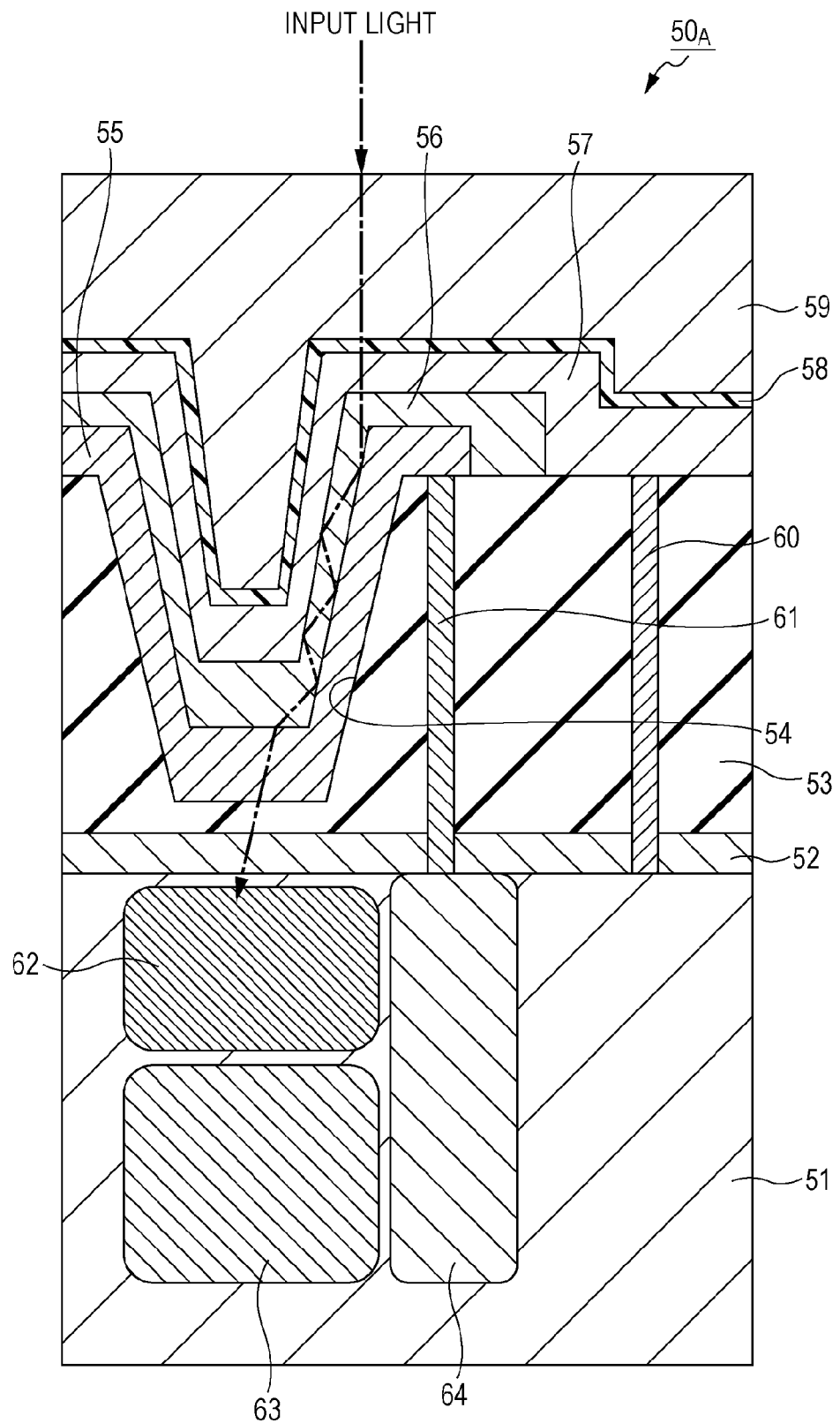

SOLID-STATE IMAGING DEVICE AND ELECTRONIC APPARATUS

BACKGROUND

The present disclosure relates to a solid-state imaging device and an electronic apparatus, and particularly, relates to a solid-state imaging device which photoelectrically converts input light using a photoelectric conversion layer, and an electronic apparatus having the solid-state imaging device.

In general, a solid-state imaging device has a configuration in which the input light is photoelectrically converted in a photoelectric conversion unit which is formed in a semiconductor substrate, and imaging is performed by reading out a charge which is obtained by the photoelectric conversion from the photoelectric conversion unit. In this type of solid-state imaging device, there may be a case where loss of light is caused along with an increased integration of pixels, or a case where a color separation, or a false color may occur, since three primary colors of light of R (red), G (green), and B (blue) are detected at different plane positions.

In order to avoid such a problem of color separation, a so-called laminated type solid-state imaging device has been proposed (for example, refer to Japanese Unexamined Patent Application Publication No. 2003-332551 (particularly, paragraphs 0077 to 0081 and FIG. 5)), in which a green photoelectric conversion layer is provided outside the semiconductor substrate, and photoelectric conversion layers of blue and red are formed in the semiconductor substrate. According to the laminated type solid-state imaging device, it is possible to solve the problem of false color due to a difference in a light receiving position, since the light of the primary colors of RGB is detected on the same plane position, and the colors can be separated.

SUMMARY

In the above described related art which is described in Japanese Unexamined Patent Application Publication No. 2003-332551 (particularly, paragraphs 0077 to 0081 and FIG. 5), it is possible to solve the problem of the false color due to a difference in light receiving position, however, on the other hand, it is necessary to make the film thickness of the photoelectric conversion film thin in order to obtain a high photoelectric conversion efficiency with a lower bias voltage. However, when the film thickness of the photoelectric conversion film becomes thin, the sensitivity of the photoelectric conversion film is decreased, since the optical path length in the photoelectric conversion film becomes short.

It is desirable to provide a solid-state imaging device and an electronic apparatus having the solid-state imaging device which can obtain a high photoelectric conversion efficiency without decreasing the sensitivity of a photoelectric conversion film.

According to an embodiment of the present disclosure, there is provided a solid-state imaging device which includes a photoelectric conversion film in a unit of pixel outside a semiconductor substrate, wherein the photoelectric conversion film is provided such that the film surface thereof is inclined to the surface of the semiconductor substrate. The solid-state imaging device is used as an image capturing unit (image reading unit) of a variety of electronic apparatuses.

In the solid-state imaging device having the above described configuration, or an electronic apparatus having the solid-state imaging device as the image capturing unit, since the film surface of the photoelectric conversion film is provided so as to be inclined to the surface of the semiconductor substrate, that is, to the substrate surface, input light is diagonally (being inclined) input with respect to the perpendicular line of the film surface of the photoelectric conversion film. Here, when the input light is input perpendicular with respect to the film surface of the photoelectric conversion film, that is, input with respect to the perpendicular line of the film surface in parallel, the optical path length of the input light in the photoelectric conversion film becomes equal to the film thickness of the photoelectric conversion film. On the contrary, the optical path length when the input light is diagonally input with respect to the perpendicular line of the film surface of the photoelectric conversion film becomes longer than the optical path length (=film thickness of the photoelectric conversion film) when the input light is input with respect to the perpendicular line thereof in parallel.

According to the present disclosure, it is possible to obtain a high photoelectric conversion efficiency without decreasing the sensitivity of the photoelectric conversion film, since it is possible to make the optical path length of the input light in the photoelectric conversion film longer compared to a case where the input light is input perpendicular to the film surface of the photoelectric conversion film even in the same film thickness.

BRIEF DESCRIPTION OF THE DRAWINGS

FIG. 5 is an explanatory diagram regarding input light which is photoelectrically converted in a photoelectric conversion film for G light, or a behavior of the input light which transmits in the photoelectric conversion film;

DETAILED DESCRIPTION OF EMBODIMENTS

Hereinafter, embodiments for performing the technology of the present disclosure (hereinafter, described as "embodiment") will be described in detail with reference to drawings. In addition, descriptions will be made in the following order.
 1. Description of embodiments
  1-1. First example
  1-2. Second example
  1-3. Third example
 2. Modified example
 3. Electronic apparatus (Imaging device)

1. DESCRIPTION OF EMBODIMENTS

The solid-state imaging device according to embodiments of the present disclosure uses a photoelectric conversion film when photoelectrically converts input light in a pixel unit. The photoelectric conversion film is provided in a state of being interposed between two transparent electrodes outside a semiconductor substrate. In addition, a charge which is obtained by the photoelectric conversion of the photoelectric conversion film is taken out by one of two transparent electrodes, and is accumulated in a charge storage unit which is provided inside the semiconductor substrate.

The charge which is accumulated in the charge storage unit is read out by a readout unit. The readout unit may be a charge transfer unit which uses, for example, a CCD (Charge Coupled Device) process, or may be a readout circuit which uses, for example, a CMOS (Complementary Metal Oxide Semiconductor) process. According to the embodiment, a case where the readout unit is the readout circuit which uses the CMOS process will be described as the example. However, the readout unit is not limited thereto.

Figure 1A:
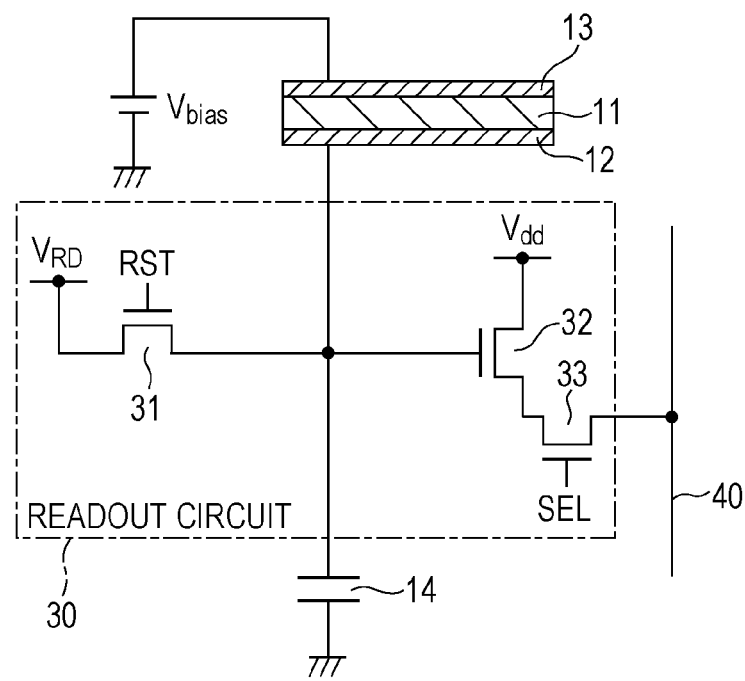
FIGS. 1A and 1B are explanatory diagrams regarding a photoelectric conversion film in a solid-state imaging device according to an embodiment of the present disclosure.
Figure 1B:
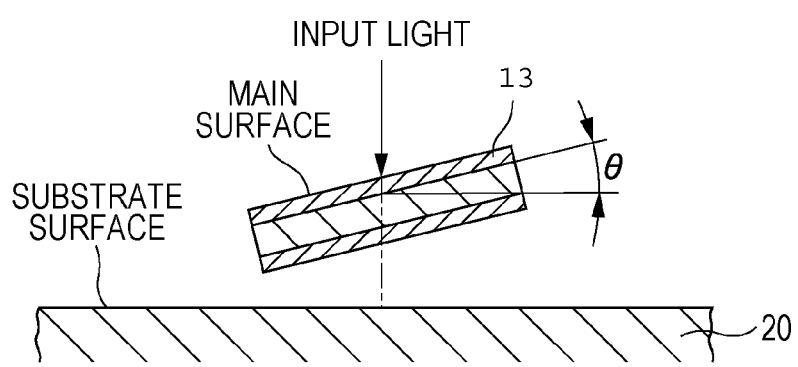

FIGS. 1A and 1B are explanatory diagrams regarding a photoelectric conversion film in a solid-state imaging device according to the embodiment of the present disclosure. Here, a case will be exemplified where the solid-state imaging device according to the embodiment of the present disclosure is a CMOS image sensor in which a readout circuit using, for example, a CMOS process as a readout unit of a charge is used. In FIGS. 1A and 1B, FIG. 1A shows a configuration example of the readout circuit as an equivalent circuit of the photoelectric conversion film, and two transparent electrodes interposing the photoelectric conversion film therebetween, and FIG. 1B shows a schematic structure of a layout of the photoelectric conversion film.

In FIGS. 1A and 1B, a photoelectric conversion film 11 is provided outside a semiconductor substrate 20 in a state of being interposed between two electrodes, that is, a lower electrode 12 and an upper electrode 13, more specifically, on the upper part of the substrate surface (front surface of the substrate). A bias voltage $V_{bias}$ is applied to the upper electrode 13. When input light is radiated to the photoelectric conversion film 11 through the upper electrode 13, in a state where the bias voltage $V_{bias}$ is applied to the upper electrode 13, the photoelectric conversion film 11 performs the photoelectric conversion with respect to light in a predetermined wavelength range which is included in the input light.

The charge which is obtained by the photoelectric conversion by the photoelectric conversion film 11 is taken out through the lower electrode 12, and is accumulated in the charge storage unit 14 which is provided inside the semiconductor substrate 20 (detailed mechanism thereof will be described later). The charge which is accumulated in the charge storage unit 14 is read out as a color light signal in a predetermined wavelength range by a readout circuit 30.

The readout circuit 30 includes, for example, a reset transistor 31, an amplifying transistor 32, and a selection transistor 33, and has a configuration in which the charge which is accumulated in the charge storage unit 14 is read out as a voltage to a column signal line 40 through the selection transistor 33 by the amplifying transistor 32.

Here, according to the embodiment, the photoelectric conversion film 11 has an advantageous structure. More specifically, as shown in FIG. 1B, the photoelectric conversion film 11 is provided in a state where the film surface of the photoelectric conversion film as the main surface thereof is inclined with respect to the surface (substrate surface) of the semiconductor substrate 20 by a predetermined angle θ.

In this manner, the input light is diagonally input (being inclined) to the perpendicular line of the film surface of the photoelectric conversion film 11, since the film surface of the photoelectric conversion film 11 is inclined with respect to the substrate surface. As a result, it is possible to obtain following operation and effect.

Figure 2A:
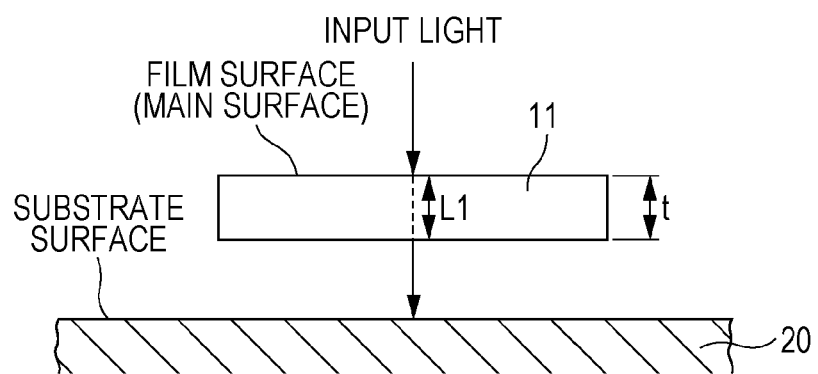
FIGS. 2A and 2B are explanatory diagrams regarding an operation or an effect of the photoelectric conversion film in the solid-state imaging device according to the embodiment.
Figure 2B:
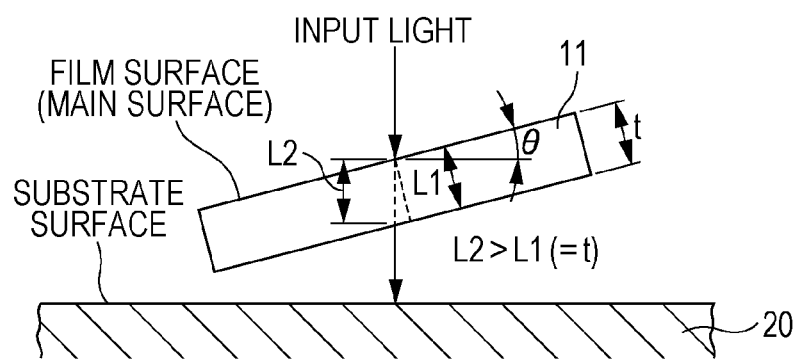

First, as shown in FIG. 2A, when the input light is input perpendicularly with respect to the film surface of the photoelectric conversion film 11, that is, input in parallel with respect to the perpendicular line of the film surface, since the optical path of the input light in the photoelectric conversion film 11 is perpendicular with respect to the film surface, the optical path length L1 of the input light becomes equal to the film thickness t of the photoelectric conversion film 11.

On the other hand, when the input light is diagonally input with respect to a normal line of the film surface of the photoelectric conversion film 11, since the optical path of the input light in the photoelectric conversion film 11 is in a state of being inclined to the film surface, the optical path length L2 of the input light becomes longer than the optical path length L1 which is the optical path length when the input light is input to the perpendicular line in parallel (that is, the film thickness $t$ of the photoelectric conversion film).

As described before, in the photoelectric conversion film 11, when making the film thickness of the photoelectric conversion film 11 thin in order to obtain a high photoelectric conversion efficiency with a lower bias voltage $V_{bias}$, the sensitivity of the photoelectric conversion film 11 is decreased, since the optical path length in the photoelectric conversion film 11 becomes short. When simply making the film thickness of the photoelectric conversion film 11 thin in order to make the optical path length in the photoelectric conversion film 11 long, it becomes difficult to take out the charge obtained by performing the photoelectric conversion.

In contrast to this, as described above, it is possible to make the optical path length L2 of the input light in the photoelectric conversion film 11 longer than the optical path length L1 which is the optical path length when the input light is input to the perpendicular line with respect to the film surface, by performing a layout so that the film surface of the photoelectric conversion film 11 is inclined to the substrate surface. Here, when it is preferable to have the same optical path length, it is possible to make the film thickness of the photoelectric conversion film 11 thin by the length of the optical path length which can be extended. Accordingly, it is possible to obtain a high photoelectric conversion efficiency without causing the decrease in sensitivity of the photoelectric conversion film 11 which is caused when making the film thickness of the photoelectric conversion film 11 thin.

Hereinafter, specific examples of the solid-state imaging device according to the embodiment of the present disclosure will be described as the first to third examples. Hereinafter, the pixel structure of the unit pixel (one pixel unit) including the photoelectric conversion film, as features of the embodiment will be mainly described.

1-1. First Example

Figure 3:
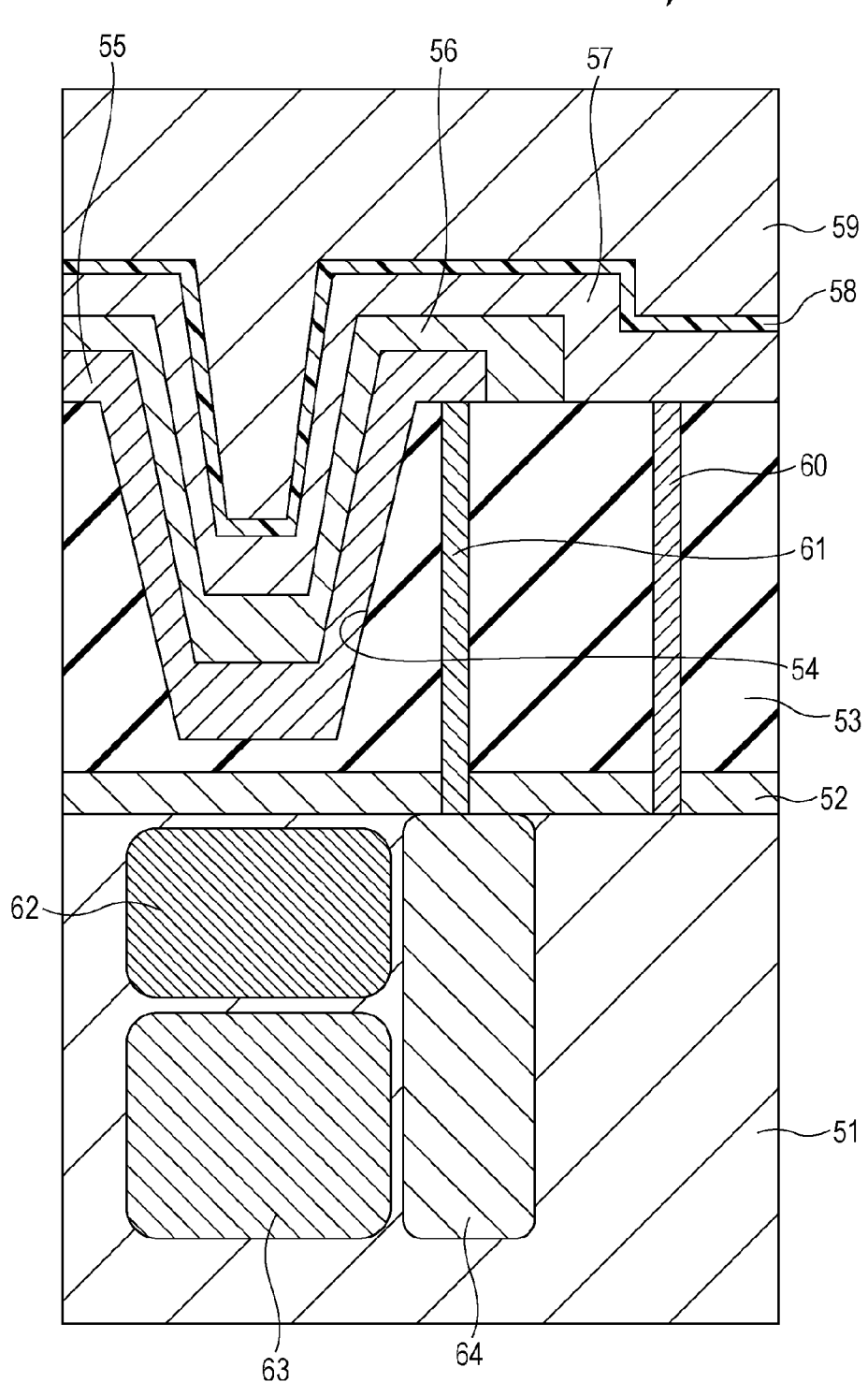
FIG. 3 is a cross-sectional view which shows a schematic pixel structure of a unit pixel according to a first example.

FIG. 3 is a cross-sectional view which shows a schematic pixel structure of a unit pixel $50_A$ according to the first example. The unit pixel $50_A$ according to the first example includes a specific photoelectric conversion film for light color in the semiconductor substrate, for example, the outside of a silicon substrate 51, and specifically, on the upper part of the substrate surface of the silicon substrate 51, and adopts a laminated structure having the photoelectric conversion film for another light color in the substrate 51.

More specifically, an antireflection film 52 is formed on the silicon substrate 51, and an interlayer film 53 which is formed of silicon oxide film or the like is formed on the antireflection film 52. A concave portion 54 is formed in the interlayer film 53 in the pixel unit. The concave portion 54 forms a forward tapered shape in which the area of the opening side positioned on the side opposite to the substrate surface of the silicon substrate 51 is widened toward the opening end thereof. The forward tapered shape can be formed using dry etching (RIE) processing, or the like.

A first transparent electrode (hereinafter, described as "lower electrode") 55 is formed on the inner wall of the concave portion 54, a photoelectric conversion film 56 is formed on the lower electrode 55, and a second transparent electrode (hereinafter, described as "upper electrode") 57 is formed on the photoelectric conversion film 56. Here, the lower electrode 55, the photoelectric conversion film 56, and the upper electrode 57 may be disposed at a part of the inner wall of the concave portion 54, however, it is preferably disposed all over the concave portion. A passivation film 58 is formed on the upper electrode 57, and a planarization film 59 is formed on the passivation film 58.

Here, the film surface of the photoelectric conversion film 56 is in a state of being inclined to the surface (substrate surface) of the silicon substrate 51, since the photoelectric conversion film 56 is interposed between the lower electrode 55 and the upper electrode 57, and is formed along the inner wall of the concave portion 54 of the forward tapered shape. The photoelectric conversion film 56 performs the photoelectric conversion with respect to light colors in a predetermined wavelength range, while transmitting light colors in other wavelength regions than that of the light colors.

The photoelectric conversion film 56 may be, for example, an organic photoelectric conversion film, or an inorganic material such as a photoelectric conversion film of amorphous silicon. In any case, it is preferable for the photoelectric conversion film to be formed of a material which shows a high transmittance of 70% or more, with respect to light in a wavelength range other than the light color which is photoelectrically converted by the photoelectric conversion film 56. When an organic material (organic photoelectric conversion film) is used as the photoelectric conversion film 56, there is an advantage in that, because of the high degree of freedom in molecule design, the desired spectral characteristics can be easily obtained.

In the first example, the photoelectric conversion film 56 is assumed to a G light photoelectric conversion film which performs the photoelectric conversion with respect to green (G) light. Accordingly, in the first example, it is preferable to use a material which exhibits a high transmittance of 70% or more with respect to the light in the wavelength range other than that of the G light, as the material of the photoelectric conversion film 56.

When the photoelectric conversion is performed in the photoelectric conversion film 56, as described above, it is necessary to apply a bias voltage to the upper electrode 57. A first wiring 60 is formed through the antireflection film 52 and the interlayer film 53 in order to apply the bias voltage from the silicon substrate 51 side. In addition, a charge which is obtained by the photoelectric conversion using the photoelectric conversion film 56 is taken out in the lower electrode 55, and a second wiring 61 is formed through the antireflection film 52 and the interlayer film 53 in order to guide the charge to the silicon substrate 51 side.

On the other hand, in the silicon substrate 51, for example, two photoelectric conversion films 62 and 63 are formed on an extension of the center line of the photoelectric conversion film 56, that is, at a portion on the extension of the center line which passes through the bottom center of the concave portion 54. Specifically, a B light photoelectric conversion layer 62 which performs the photoelectric conversion, for example, with respect to blue light is formed on the surface side of the silicon substrate 51 on the extension of the centerline of the concave portion 54. In addition, an R light photoelectric conversion layer 63 which performs the photoelectric conversion, for example, with respect to red light is formed at a portion which is deeper than the B light photoelectric conversion layer 62.

A charge storage unit 64 is further formed in the silicon substrate 51 in a state of reaching the surface of the silicon substrate 51. The charge which is obtained by the photoelectric conversion in the photoelectric conversion film 56, and is taken out by the lower electrode 55 is supplied to the charge storage unit 64, through the second wiring 61. That is, the charge storage unit 64 is the G light charge storage unit which accumulates the charge which is obtained by the photoelectric conversion in the G light photoelectric conversion film 56.

The unit pixel $50_A$ according to the first example with the above described pixel structure has a laminated structure in which the G light photoelectric conversion film 56 is provided at the upper part of the substrate surface of the silicon substrate 51, and the B light photoelectric conversion layer 62 and the R light photoelectric conversion layer 63 are sequentially provided, in the silicon substrate 51. In addition, the G light photoelectric conversion film 56, the B light photoelectric conversion layer 62, and the R light photoelectric conversion layer 63 are positioned all together on the extension of the center line which passes through the center of the bottom portion of the concave portion 54, that is, on the optical axis of the input light. In this manner, it is possible to solve the problem of the false color due to a difference in the light receiving position, since it is possible to detect the light of three primary colors of RGB on the same plane position, and to perform the color separation in the depth direction of the substrate.

In the unit pixel $50_A$ having laminated structure described in the first example, the photoelectric conversion film 11 is formed at a concave portion 54 having a wall inclined with respect to the substrate surface. Here, the forward tapered concave portion 54 has the same function as that of concave portion for forming a waveguide in the solid-state imaging device having unit pixels of an existing waveguide structure.

In this manner, the photoelectric conversion film 56 is formed using the forward tapered concave portion 54. More specifically, the photoelectric conversion film forms a waveguide in which a concentration efficiency of input light to the unit pixel $50_A$ is improved, by being provided along the inner wall of the concave portion 54. That is, the photoelectric conversion film 56 has a function of a waveguide for high concentration of light, in addition to the original function of the photoelectric conversion.

In this manner, it is possible to improve the light concentration property, particularly, to improve the sensitivity with respect to the diagonal input light, since the photoelectric conversion film 56 has a waveguide structure. In addition, the photoelectric conversion film 56 having the waveguide structure absorbs the G light in the input light, and performs the photoelectric conversion with respect to the G light, while transmitting the light in a wavelength range other than that of the G light, by being applied with a bias voltage (the bias voltage $V_{bias}$ in FIG. 1) through the first wiring 60 with respect to the upper electrode 67.

The charge which is obtained by the photoelectric conversion in the photoelectric conversion film 56 is taken out by the lower electrode 55, is guided to the charge storage unit 64 in the silicon substrate 51 through the second wiring 61, and is accumulated in the charge storage unit 64. The charge storage unit 64 corresponds to the charge storage unit 14 in FIG. 1. In addition, the accumulated charge of the charge storage unit 64 is read out by the readout circuit 30 in FIG. 1, and is output to the column signal line 40 as a voltage.

On the other hand, in the light in the wavelength range which has transmitted the photoelectric conversion film 56, the B light is photoelectrically converted by the B light photoelectric conversion layer 62, and is accumulated in the photoelectric conversion layer 62. In addition, the R light is photoelectrically converted by the R light photoelectric conversion layer 63, and is accumulated in the photoelectric conversion layer 63. An example of the readout circuit which reads out the charge which is accumulated in the photoelectric conversion layer 62 and the photoelectric conversion layer 63 is shown in FIGS. 4A and 4B.

Figure 4A:
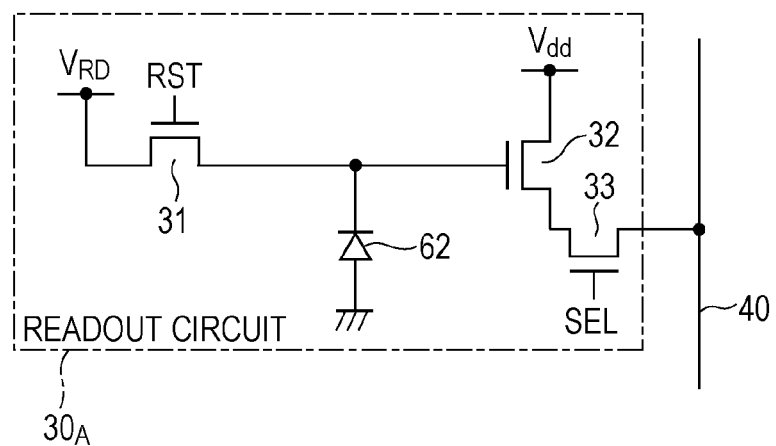
FIGS. 4A and 4B are circuit diagrams which show an example of a reading out circuit for B light and R light.
Figure 4B:
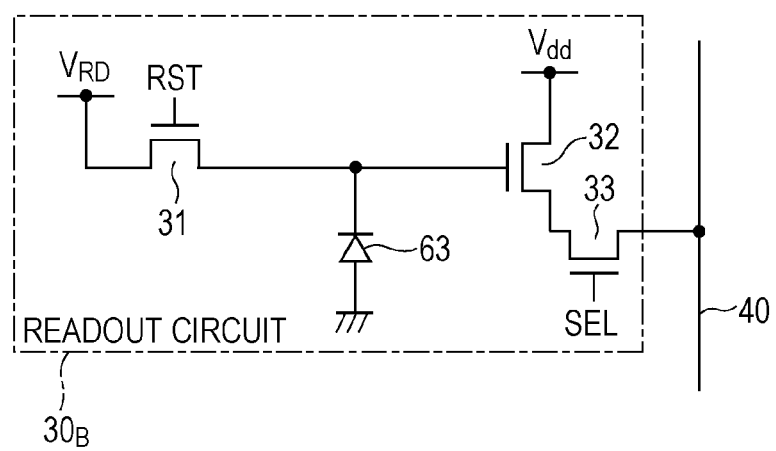

Both readout circuits $30_A$ and $30_B$ for the B light and the R light shown in FIGS. 4A and 4B has basically the same circuit configuration as that of the G light readout circuit 30 which is shown in FIG. 1. Here, the B light photoelectric conversion layer 62 and the R light photoelectric conversion layer 63 are shown as the layers which are formed of, for example, photodiode. In addition, each accumulated charge of the photoelectric conversion films 62 and 63 is read out by the readout circuits $30_A$ and $30_B$, and is output to the column signal line 40 as the voltage.

Here, a behavior of the input light which is photoelectrically converted in the G light photoelectric conversion film 56, or the input light which is transmitted in the G light photoelectric conversion film 56 will be described using FIG. 5. In addition, in FIG. 5, the input light is denoted by a thick dot and dash line. In addition, in order to make the optical path in the photoelectric conversion film 56 obvious, the photoelectric conversion film 56 is shown in white.

As shown in FIG. 5, the light which is input to the unit pixel $50_A$ is input to the photoelectric conversion film 56 through a planarization film 59, a passivation film 58 and the upper electrode 57. Here, the film surface of the photoelectric conversion film 56 is inclined with respect to the substrate surface of the silicon substrate 51, and more specifically, is provided along the inner wall surface of the forward tapered concave portion 54. Accordingly, as shown in the dot and dash line, light which is input to the photoelectric conversion film 56 is repeatedly reflected in the inner wall surface (interface) of the photoelectric conversion film 56, and proceeds to the bottom face of the concave portion 54.

Here, the G light in the light which is input to the photoelectric conversion film 56 is absorbed while being repeatedly reflected in the photoelectric conversion film 56, and is photoelectrically converted. At this time, the optical path length of the input light in the photoelectric conversion film 56 becomes much longer compared to a case where the light is input perpendicular with respect to the film surface of the photoelectric conversion film 56. In addition, when the same optical path length is desired, it is possible to make the film thickness of the photoelectric conversion film 56 thin by the length of the optical path length which can be extended. Accordingly, it is possible to obtain the high photoelectric conversion efficiency without lowering the sensitivity of the photoelectric conversion film 56 which is caused by making the film thickness of the photoelectric conversion film 56 thin.

On the other hand, as shown in the dot and dash line, the light in the wavelength range other than that of the G light is repeatedly reflected in the photoelectric conversion film 56, and is input to a silicon substrate 71 through the lower electrode 55, the interlayer film 53, and the antireflection film 52. In addition, the B light is photoelectrically converted in the B light photoelectric conversion layer 62, and the R light is photoelectrically converted in the R light photoelectric conversion layer 63.

In addition, as described above, the light which is input to the photoelectric conversion film 56 is repeatedly reflected in the photoelectric conversion film 56, however, the light is assumed to be reflected at the interface between the transparent lower electrode 55 and the interlayer film 53 in practice, as well. Here, in order to make the input light be totally reflected at the interface between the lower electrode 55 and the interlayer film 53, it is preferable that the refractivity of the lower electrode 55 be sufficiently high compared to the refractivity (1.46) of the interlayer film 53 which is formed of, for example, silicon oxide film. Specifically, as the electrode material of the lower electrode 55, it is preferable to use stannous oxide ($SnO_2$ of which the refractivity is approximately 1.9), indium tin oxide (ITO of which the refractivity is approximately 2.1 to 2.2), zinc oxide (ZnO of which the refractivity is approximately 1.9 to 2.0), or the like.

However, when a material of which the refractivity is close to that of the interlayer film 53 is used as the material of the lower electrode 55, it is preferable to provide, for example, a silicon nitride film (of which the refractivity is 2.0) or the like between the lower electrode 55 and the interlayer film 53. In other words, by providing the silicon nitride film or the like between the lower electrode 55 and the interlayer film 53, the above described material is not necessarily used as the electrode material of the lower electrode 55. That is, as the electrode material of the lower electrode 55, it is possible to use a variety of materials, in addition to the above described material.

On the other hand, it is preferable to select an electrode material of which the refractivity is low compared to the photoelectric conversion film 56, for the transparent upper electrode 57. When it is difficult, it is possible to extend the optical path length of the input light in the photoelectric conversion film 56, by arranging a film of which the refractivity is low, for example, such as a silicon oxide film on the upper electrode 57. In addition, when embedding the waveguide which is formed by laminating the lower electrode 55, the photoelectric conversion film 56, and the upper electrode 57 to the forward tapered concave portion 54, it is preferable to use a silicon oxide film, silicon nitride film, polyimide film, or the like.

As described above, according to the unit pixel $50_A$ relating to the first example which adopts the laminated structure, it is possible to extend the optical path length in the photoelectric conversion film 56, by providing the photoelectric conversion film 56 along the inner wall of the forward tapered concave portion 54, accordingly, it is possible to improve the photoelectric conversion efficiency. In addition, since the waveguide is formed by providing the photoelectric conversion film 56 along the inner wall of the forward tapered concave portion 54, it is possible to improve the light concentration property due to the waveguide, particularly, to improve the sensitivity with respect to the diagonal input light.

Here, when, particularly, an organic photoelectric conversion film is used as the photoelectric conversion film 56, there is a problem in that the photoelectric conversion efficiency thereof is low compared to the photoelectric conversion films 62 and 63 which are formed in the silicon substrate 51. However, according to the first example, since it is possible to improve the photoelectric conversion efficiency due to the extension of the optical path length in the photoelectric conversion film 56, it is possible to obtain the desired photoelectric conversion efficiency, due to the extendible optical path length in the photoelectric conversion film 56, even when the organic photoelectric conversion film is used as the photoelectric conversion film 56. As described above, as well, since the degree of freedom in designing of molecule is high by adopting the organic photoelectric conversion film as the photoelectric conversion film 56, it is possible to obtain the desired spectral characteristics.

In addition, regarding the photoelectric conversion film 56, it is possible to further improve the photoelectric conversion efficiency, since it is possible to secure the area of the photoelectric conversion film 56, and to improve the light use efficiency, by adopting the configuration of providing the photoelectric conversion film 56 on the entire inner wall of the concave portion 54, even though the configuration of providing the photoelectric conversion film 56 at a part of the inner wall of the concave portion 54 is good.

1-2. Second Example

Figure 6:
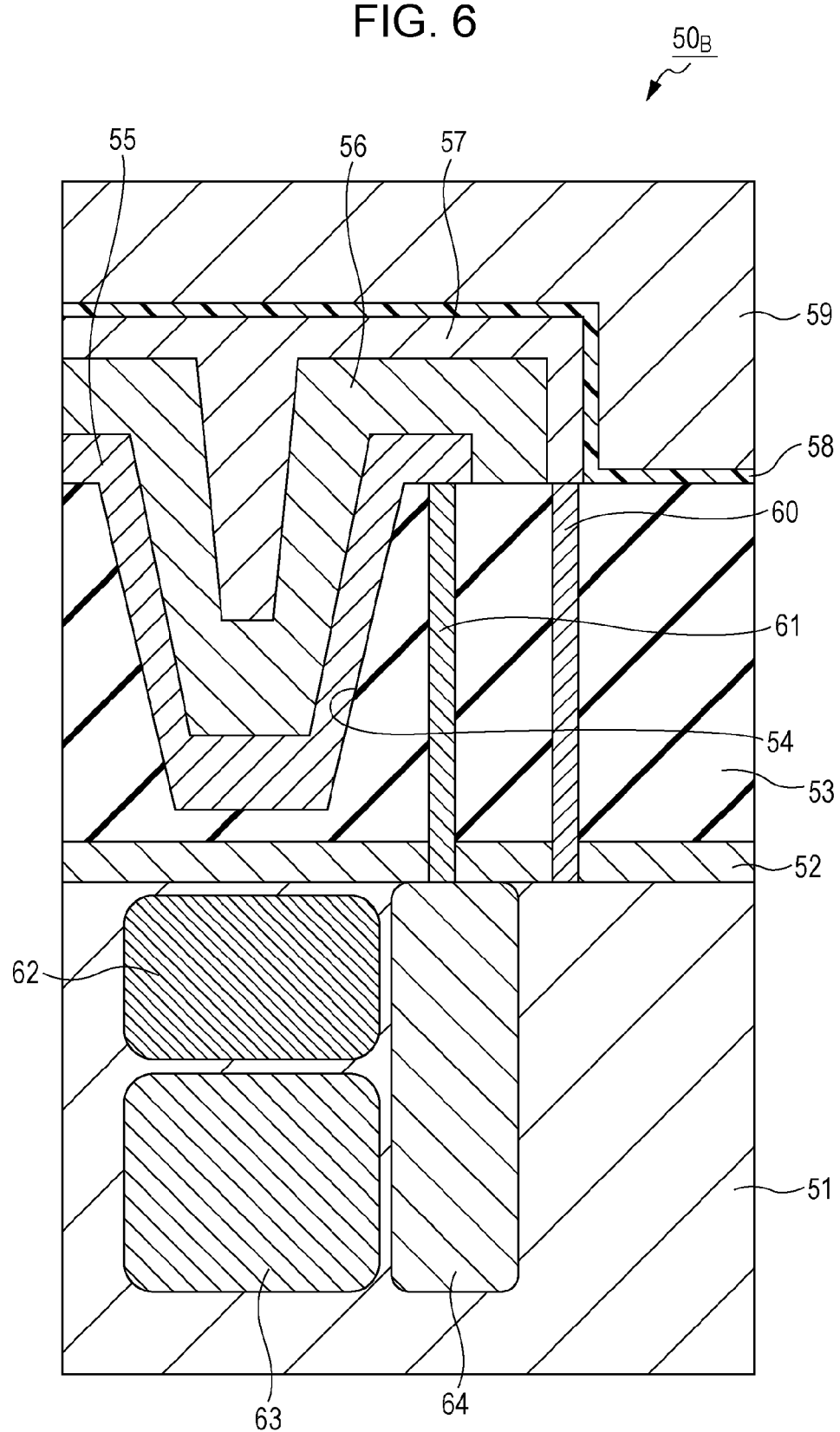
FIG. 6 is a cross-sectional view which shows a schematic pixel structure of a unit pixel according to a second example.

FIG. 6 is a cross-sectional view which shows a schematic pixel structure of a unit pixel $50_B$ according to a second example, and is shown by being provided with the same reference numerals as those in FIG. 3 in the figure at the same portions.

Similarly to the unit pixel $50_A$ according to the first example, the unit pixel $50_B$ according to the second example also has the laminated structure in which the G light photoelectric conversion film 56 is provided at the upper part of the silicon substrate 51, and the B light photoelectric conversion layer 62 and the R light photoelectric conversion layer 63 are sequentially provided in the silicon substrate 51. Further, the unit pixel $50_B$ according to the second example has the same configuration as that of the unit pixel $50_A$ according to the first example, since the waveguide for the high light concentration efficiency is formed, as well, by providing the photoelectric conversion film 56 along the inner wall of the concave portion 54.

In addition, the difference from the unit pixel $50_A$ according to the first example is as follows. That is, the unit pixel $50_B$ according to the second example has a configuration in which the film thickness of the photoelectric conversion film 56 is set to be thicker than that of the unit pixel $50_A$ according to the first example. In this manner, since it is possible to make the optical path length in the photoelectric conversion film 56 be long compared to the case of the unit pixel $50_A$ according to the first example by making the film thickness of the photoelectric conversion film 56, the sensitivity of the photoelectric conversion film 56 can be increased.

In addition, when the film thickness of the photoelectric conversion film 56 becomes thick, as shown in FIG. 6, there may be a case where the inside of the waveguide is buried by laminating the lower electrode 55, the photoelectric conversion film 56, and the upper electrode 57. Also, the lower electrode 55, the photoelectric conversion film 56, and the upper electrode 57 may be laminated depending on the relationship between the thickness of the photoelectric conversion film and the diameter of the waveguide, that is, the diameter of the concave portion 54. However, even if the inside of the waveguide is buried, the operation of the photoelectric conversion by the photoelectric conversion film 56, the operation of light concentration by the waveguide, or the like are not adversely affected. That is, even in a case of the unit pixel 50B according to the second example with the pixel structure in which the inside of the waveguide is buried, it is possible to obtain the same operation and the effect as those of the unit pixel 50A according to the first example.

1-3. Third Embodiment

Figure 7:
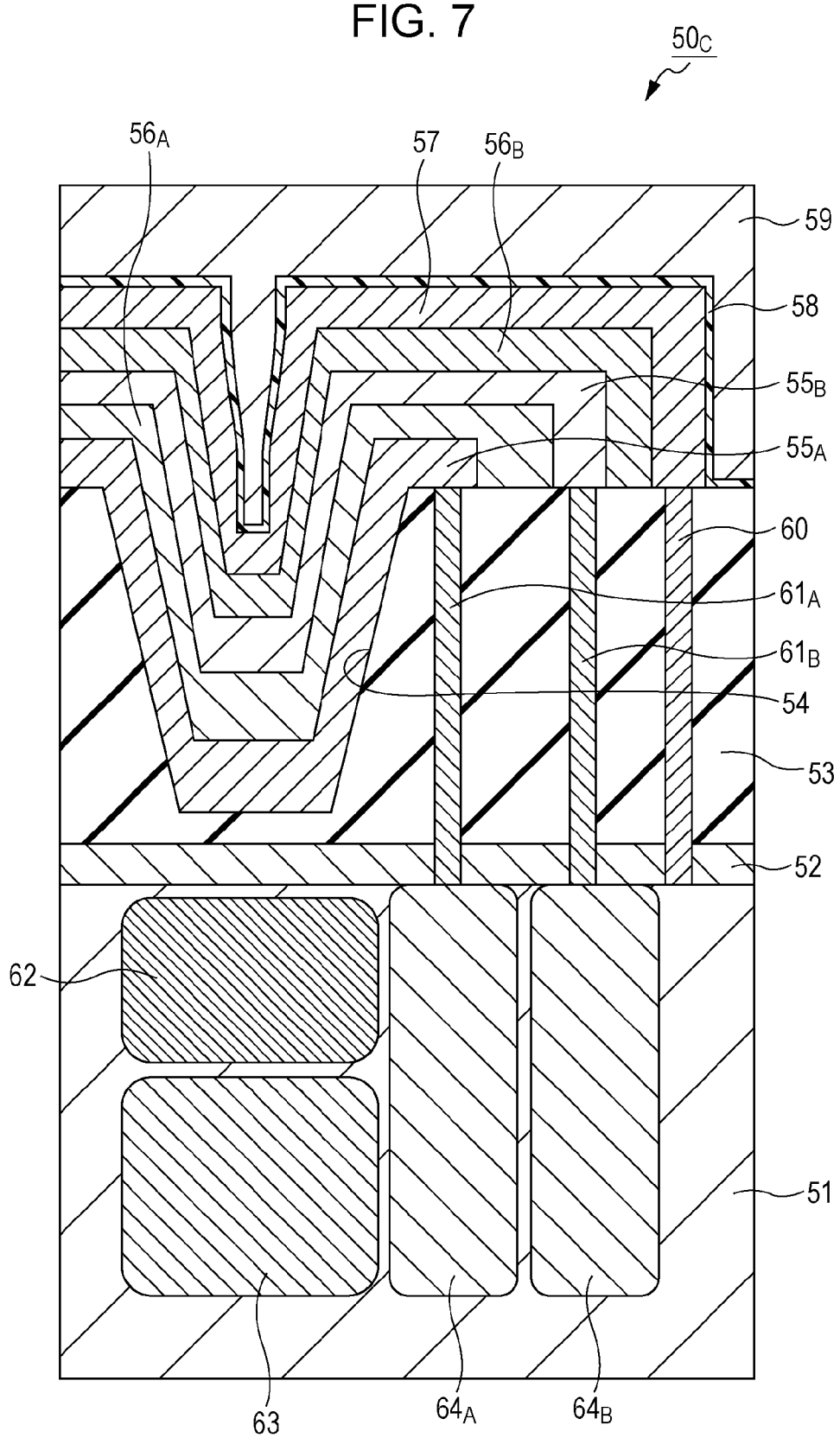
FIG. 7 is a cross-sectional view which shows a schematic pixel structure of a unit pixel according to a third example.

FIG. 7 is a cross-sectional view which shows a schematic pixel structure of a unit pixel $50_C$ according to a third embodiment, and the same portions as those in FIG. 3 in the drawing are denoted by being provided with the same reference numerals.

Similarly to the unit pixel $50_A$ according to the first example, the unit pixel $50_C$ according to the third embodiment has the laminated structure in which the G light photoelectric conversion film 56 is provided at the upper part of the silicon substrate 51, and the B light photoelectric conversion layer 62 and the R light photoelectric conversion layer 63 are sequentially provided in the silicon substrate 51. Further, the unit pixel $50_C$ according to the third example has the same configuration as that of the unit pixel $50_A$ according to the first example, since the waveguide for the high light concentration efficiency is formed, as well, by providing the photoelectric conversion film 56 along the inner wall of the concave portion 54.

In addition, the difference from the unit pixel $50_A$ according to the first example is as follows. That is, the unit pixel $50_A$ according to the first example has the pixel structure in which the G light photoelectric conversion film 56 and two electrodes 55 and 57 which interpose the photoelectric conversion film 56 therebetween has the pixel structure of a single layer. In contrast to this, the unit pixel $50_B$ according to the second example has a laminated pixel structure of two layers or more (two layers in the example).

Specifically, a first lower electrode $55_A$ is formed on the inner wall of the concave portion 54, a first photoelectric conversion film $56_A$ is formed on the first lower electrode $55_A$, and a second lower electrode $55_B$ is formed on the photoelectric conversion film $56_A$. In addition, a second photoelectric conversion film $56_B$ is formed on the second lower electrode $55_B$, and the upper electrode 57 is formed on the second photoelectric conversion film $56_B$.

In the above described unit pixel $50_C$ of the pixel unit, a charge which is obtained by photoelectric conversion due to the first photoelectric conversion film $56_A$ is read out by the first lower electrode $55_A$, and is accumulated in a charge storage unit $64_A$ which is formed in the silicon substrate 51 through one second wiring $61_A$. In addition, a charge which is obtained by photoelectric conversion due to the second photoelectric conversion film $56_B$ is read out by the second lower electrode $55_B$, and is accumulated in a charge storage unit $64_A$ which is formed in the silicon substrate 51 through the other second wiring $61_B$.

In this manner, it is possible to improve the photoelectric conversion efficiency with respect to the G light, and to increase the sensitivity thereof, compared to a case of a single layer structure, by adopting a configuration in which the G light photoelectric conversion films 56 ($56_A$ and $56_B$) are the multilayer structure.

2. MODIFIED EXAMPLE

In the above described first to third examples, it is based on the laminated structure in which the G light photoelectric conversion film 56 is provided at the upper part of the silicon substrate 51, and the B light photoelectric conversion layer 62 and the R light photoelectric conversion layer 63 are sequentially provided in the silicon substrate 51. However, the technology of the present disclosure is not limited to this application of the laminated structure.

Figure 8:
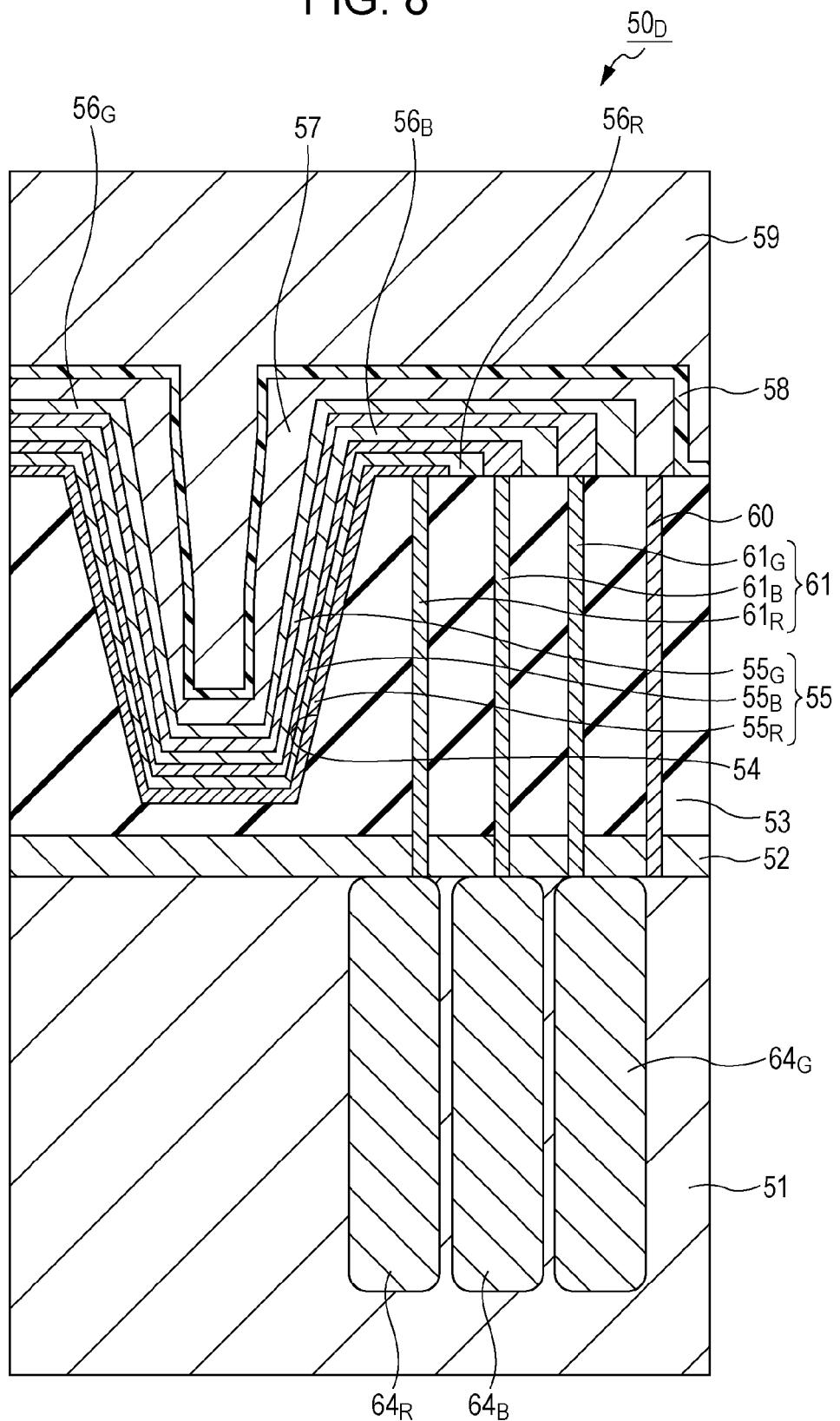
FIG. 8 is a cross-sectional view which shows a schematic pixel structure of a unit pixel according to a modified example.

As an example, it is possible to use the technology of the present disclosure even in the pixel structure with a configuration in which the photoelectric conversion is performed using the photoelectric conversion film even for the B light and R light, not only for the G light. Specifically, as shown in FIG. 8, it is possible to use the technology of the present disclosure even in a unit pixel $50_D$ with a pixel structure of a waveguide structure in which, for example, the R light photoelectric conversion film $56_R$, the B light photoelectric conversion film $56_B$, and the G light photoelectric conversion film $56_G$ are sequentially laminated in the forward tapered concave portion 54 at the upper part of the silicon substrate 51.

In a case of this pixel structure, the lower electrodes $55_R$, $55_B$, and $55_G$ are independently provided at the lower side of the photoelectric conversion films $56_R$, $56_B$, and $56_G$, respectively, in contrast to a structure in which the upper electrode 57 is commonly provided at the uppermost layer with respect to the photoelectric conversion films $56_R$, $56_B$, and $56_G$. In addition, a charge which is photoelectrically converted using the photoelectric conversion films $56_R$, $56_B$, and $56_G$ is taken out by the lower electrodes $55_R$, $55_B$, and $55_G$, is guided to charge storage units $64_R$, $64_B$, and $64_G$ which are formed in the silicon substrate 51, using second wirings $61_R$, $61_B$, and $61_G$, and is accumulated therein.

In this manner, when using the photoelectric conversion film with respect to the B light and R light, not only to the G light, it is possible to extend the optical path length in the photoelectric conversion films $56_R$, $56_B$, and $56_G$ by configuring the waveguide structure in which the photoelectric conversion films $56_R$, $56_B$, and $56_G$ are laminated in the forward tapered concave portion 54. As a result, it is possible to improve the photoelectric conversion efficiency, compared to a case where the light is input perpendicular to the film surface of the photoelectric conversion films $56_R$, $56_B$, and $56_G$. In addition, it is possible to improve the light concentration property due to the waveguide, particularly, to improve the sensitivity with respect to the diagonal input light.

In addition, here, the photoelectric conversion films $56_R$ and $56_B$ of the B light and R light are provided in the forward tapered concave portion 54, similarly to the G light photoelectric conversion films $56_G$, however, when it is not necessary to extend the optical path length, it is possible to adopt a pixel structure in which the film surface is arranged in parallel with respect to the substrate surface of the silicon substrate 51.

Further, even in the unit pixel $50_D$ according to the modification example, as in the case of the second example, it is possible to adopt a configuration in which the film thickness of a specified photoelectric conversion film becomes thicker than another photoelectric conversion film. In addition, as in the case of the third example, it is possible to adopt a configuration in which a specified photoelectric conversion film, for example, the G light photoelectric conversion films $56_G$ has the multilayer structure.

In addition, in the above described embodiment, a case is exemplified in which the readout unit which reads out the charge which is accumulated in the photoelectric conversion layers 62 and 63, and the storage unit 64 is the readout circuit using the CMOS process, however, the readout unit is not limited to this. According to the present disclosure, it is possible to use a charge transfer unit using, for example, the CCD process as the readout unit regardless of the configuration thereof.

In addition, the present disclosure can be applied to solid-state imaging devices in general which capture infrared light, X-rays, or distribution of incident particles, or the like, as an image, without being limited to the application to a solid-state imaging device which detects, and captures as an image, the distribution of the incident ray volume of visible light.

Further, the solid-state imaging device may be a type which is formed as one chip, or may be a module type in which an imaging unit and a signal processing unit, or an optical system are integrally packaged, and has an image capturing function.

3. ELECTRONIC APPARATUS

The present disclosure is not only applied to a solid-state imaging device, but to electronic apparatus in general which use the solid-state imaging device as the image capturing unit (photoelectric conversion unit), for example, an imaging device such as a digital still camera or a video camera, or a mobile terminal device with a function of image capturing such as a mobile phone or the like. A copying machine which adopts the solid-state imaging device as the image reading unit is included in the electronic apparatus which adopts the solid-state imaging device as the image reading unit. In addition, there is a case where the above described module type which is mounted to the electronic apparatus, that is, a camera module, is adopted as the imaging device.

Imaging Device

Figure 9:
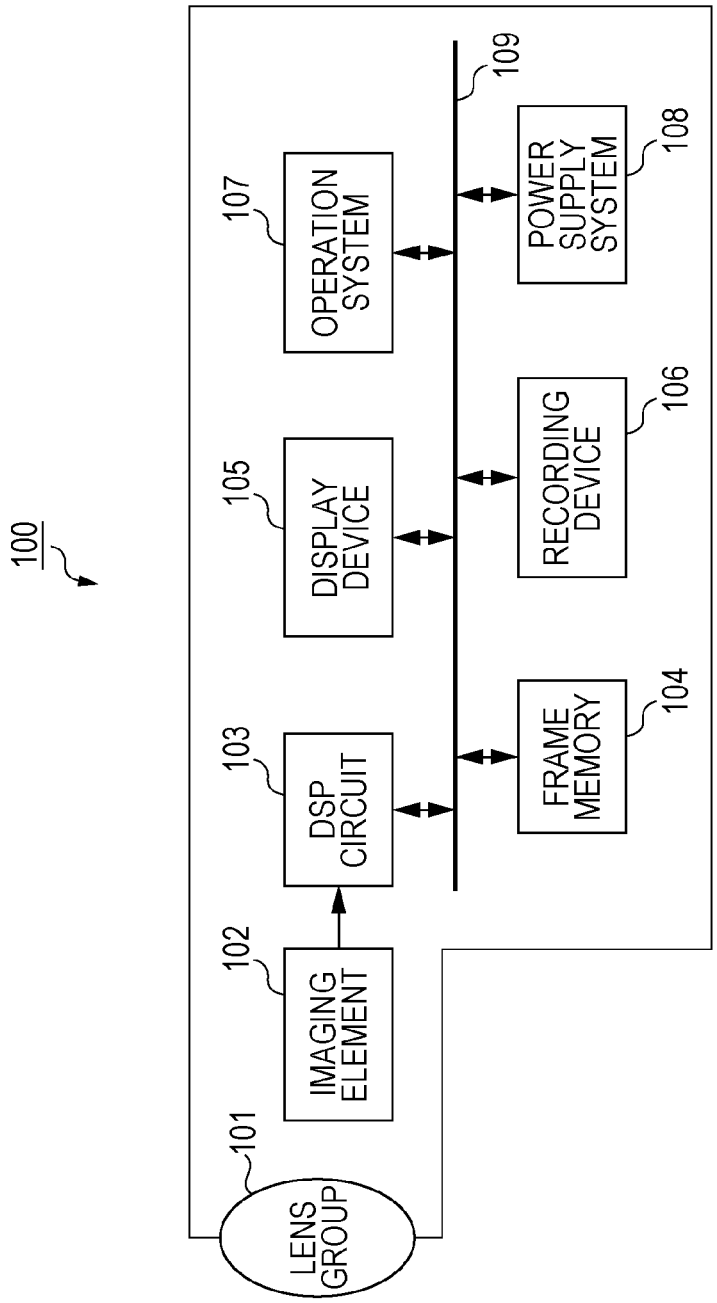
FIG. 9 is a block diagram which shows a configuration example of an electronic apparatus according to the present disclosure, for example, an imaging device.

FIG. 9 is a block diagram which shows an example of a configuration of an electronic apparatus according to the present disclosure, for example, an imaging device.

As shown in FIG. 9, in an imaging device 100 according to the present disclosure includes an optical system including such as a lens group 101, an imaging element (imaging device) 102, a DSP circuit 103, a frame memory 104, a display device 105, a recording device 106, an operation system 107, a power supply system 108, or the like. In addition, in the imaging device, the DSP circuit 103, the frame memory 104, the display device 105, the recording device 106, the operation system 107, and the power supply system 108 are connected to each other through a bus line 109.

The lens group 101 captures input light (optical image) from an object, and forms the image on an imaging surface of the imaging element 102. The imaging element 102 converts the intensity of the input light which is formed as an image on the imaging surface by the lens group 101 to an electric signal in pixel units, and outputs as a pixel signal.

The display device 105 is formed of a panel-type display device such as a liquid crystal display device, or an organic EL (electro luminescence) display device, and displays a moving image or a still image which is captured in the imaging element 102. The recording device 106 records the moving image or the still image which is captured by the imaging element 102 on a recording medium such as a video tape, a DVD (Digital Versatile Disc), or the like.

The operation system 107 gives operation instructions with respect to a variety of functions provided in the imaging device under the user's operation. The power supply system 108 appropriately supplies various types of power as the operation power of the DSP circuit 103, the frame memory 104, the display device 105, the recording device 106, and the operation system 107 to these supply targets.

The imaging device with the above described configuration is able to be used as a video camera, a digital still camera, further, a variety of imaging devices such as a camera module for a mobile device such as a mobile phone. In addition, in the imaging device, as an image capturing unit, that is, as the imaging element 102, it is possible to obtain the following operation and effect, by using the solid-state imaging device according to the above described embodiment.

That is, since the solid-state imaging device according to the above described embodiment can extend the optical path length of the input light in the photoelectric conversion film, it is possible to obtain the high photoelectric conversion efficiency without decreasing the sensitivity of the photoelectric conversion film. Accordingly, it is possible to obtain a captured image with high image quality, using the solid-state imaging device as the image capturing unit in a variety of imaging devices.

The present disclosure contains subject matter related to that disclosed in Japanese Priority Patent Application JP 2011-073925 filed in the Japan Patent Office on Mar. 30, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising: a photoelectric conversion film which is interposed between two transparent electrodes outside a semiconductor substrate,
wherein a film surface of the photoelectric conversion film and the two transparent electrodes are inclined with respect to a front surface of the semiconductor substrate, and
wherein the photoelectric conversion film and the two transparent electrodes are located in a concave portion which is formed in an interlayer film on the semiconductor substrate.

2. The solid-state imaging device according to claim 1, wherein the photoelectric conversion film performs photoelectric conversion with respect to light in a predetermined wavelength range, and transmits light in another wavelength range.

3. The solid-state imaging device according to claim 2, wherein the photoelectric conversion film and the two transparent electrodes are arranged along an inner wall of the concave portion, wherein the photoelectric conversion film forms a waveguide which condenses input light, and wherein the concave portion forms a forward tapered shape.

4. The solid-state imaging device according to claim 3, wherein the photoelectric conversion film is formed of a material with a transmittance of 70% or more with respect to the light in another wavelength range.

5. The solid-state imaging device according to claim 3, further comprising: a photoelectric conversion layer in the semiconductor substrate wherein the photoelectric conversion layer performs photoelectric conversion with respect to the light in another wavelength range which has been transmitted through the photoelectric conversion film.

6. The solid-state imaging device according to claim 5, wherein the photoelectric conversion layer is positioned on an extension of a center line of the photoelectric conversion film.

7. The solid-state imaging device according to claim 1, further comprising: a charge storage unit which accumulates a charge which is photoelectrically converted in the photoelectric conversion film, in the semiconductor substrate.

8. The solid-state imaging device according to claim 1, wherein the photoelectric conversion film is laminated in two or more layers.

9. The solid-state imaging device according to claim 8, wherein the two or more layers perform the photoelectric conversion together, with respect to light in the same wavelength range.

10. The solid-state imaging device according to claim 8, wherein the two or more layers respectively perform the photoelectric conversion with respect to light in different wavelength ranges.

11. The solid-state imaging device according to claim 1, wherein a refractivity of one of the two transparent electrodes that is closest to the interlayer film is higher than a refractivity of the interlayer film.

12. An electronic apparatus comprising: a solid-state imaging device, wherein the solid-state imaging device has a photoelectric conversion film interposed between two transparent electrodes in pixel units outside a semiconductor substrate, wherein a film surface of the photoelectric conversion film and the two transparent electrodes are inclined with respect to a front surface of the semiconductor substrate, and wherein the photoelectric conversion film and the two transparent electrodes are located in a concave portion which is formed in an interlayer film on the semiconductor substrate.

13. A solid-state imaging device comprising: at least two photoelectric conversion films, each of which being interposed between two transparent electrodes outside a semiconductor substrate, wherein a film surface of each of the photoelectric conversion films is provided so as to incline with respect to a front surface of the semiconductor substrate, wherein each of the photoelectric conversion films transmits light in a different and distinct wavelength range, and wherein the at least two photoelectric conversion films and the two transparent electrodes are located in a concave portion which is formed in an interlayer film on the semiconductor substrate.

14. The solid-state imaging device according to claim 1, wherein one of the two transparent electrodes is in continuous contact with an entire length of the inner wall of the concave portion.

15. The electronic apparatus according to claim 12,
wherein the photoelectric conversion film and the two transparent electrodes are arranged along an inner wall of the concave portion, wherein the interlayer film is formed on an antireflection film on the semiconductor substrate, and wherein the photoelectric conversion film forms a waveguide which condenses input light and wherein the concave portion forms a forward tapered shape.

16. The electronic apparatus according to claim 15,
wherein the solid-state imaging device comprises a first wiring formed through the antireflection film and the interlayer film in order to apply a bias voltage from the semiconductor substrate.

17. The electronic apparatus according to claim 15,
wherein the solid-state imaging device comprises a second wiring formed through the antireflection film and the interlayer film in order to guide a charge to the semiconductor substrate, wherein the charge is obtained by the photoelectric conversion film.

* * * * *